United States Patent
Molyneaux et al.

(10) Patent No.: US 7,696,751 B2
(45) Date of Patent: Apr. 13, 2010

(54) METHOD AND APPARATUS FOR FERROUS OBJECT AND/OR MAGNETIC FIELD DETECTION FOR MRI SAFETY

(75) Inventors: David A. Molyneaux, Gainesville, FL (US); Jeanette Ciesla, Gainesville, FL (US); Dimitris Tsalikis, Gainesville, FL (US)

(73) Assignee: Koninklijke Philips electronics N. V., Eindhoven (NL)

( * ) Notice: Subject to any disclaimer, the term of this patent is extended or adjusted under 35 U.S.C. 154(b) by 482 days.

(21) Appl. No.: 11/635,417

(22) Filed: Dec. 7, 2006

(65) Prior Publication Data

US 2007/0132581 A1 Jun. 14, 2007

Related U.S. Application Data

(60) Provisional application No. 60/748,635, filed on Dec. 8, 2005.

(51) Int. Cl.
*G01V 3/00* (2006.01)

(52) U.S. Cl. .................................. 324/301; 324/300

(58) Field of Classification Search ......... 324/300–345; 600/407–445
See application file for complete search history.

(56) References Cited

U.S. PATENT DOCUMENTS

| | | | |
|---|---|---|---|
| 6,836,212 B2 * | 12/2004 | Sawinski | 340/539.23 |
| 7,015,790 B1 * | 3/2006 | Schrott et al. | 340/5.2 |
| 7,113,092 B2 * | 9/2006 | Keene | 340/551 |
| 7,135,976 B2 * | 11/2006 | Neff et al. | 340/572.1 |
| 7,145,456 B2 * | 12/2006 | Castle | 340/552 |
| 7,260,221 B1 * | 8/2007 | Atsmon | 380/247 |
| 7,383,297 B1 * | 6/2008 | Atsmon et al. | 709/200 |
| 7,489,128 B2 * | 2/2009 | Kopp | 324/227 |
| 7,518,374 B1 * | 4/2009 | Olsson et al. | 324/326 |
| 2001/0051766 A1 * | 12/2001 | Gazdzinski | 600/309 |
| 2003/0171669 A1 | 9/2003 | Kopp | |
| 2004/0070499 A1 * | 4/2004 | Sawinski | 340/568.1 |
| 2004/0135687 A1 | 7/2004 | Keene | |
| 2008/0122441 A1 * | 5/2008 | Hayakawa | 324/318 |

* cited by examiner

*Primary Examiner*—Brij B Shrivastav

(57) ABSTRACT

A method and apparatus for ferrous object and/or magnetic field detection are provided. Embodiments can improve magnetic resonance imaging (MRI) safety and increase the safety of MRI facilities. Embodiments can detect a given magnetic field strength around a MRI machine and alert users to the field's presence. In an embodiment, the magnetic field warning system can rely on a single badge that warns its user. In another embodiment, the badge can utilize an RFID system. The RFID system can turn the badge on when it enters the MRI room and off when it leaves the MRI room. In another embodiment, a badge with a rechargeable battery and charger can be utilized with or without an RFID tag. The subject badges or other detection devices can be worn by a person, located on or near a ferrous object, embedded in clothing, or located in other positions convenient to a user.

20 Claims, 8 Drawing Sheets

METHOD AND APPARATUS FOR FERROUS OBJECT AND/OR MAGNETIC FIELD DETECTION FOR MRI SAFETY

CROSS-REFERENCE TO RELATED APPLICATION

The present application claims the benefit of U.S. Application Ser. No. 60/748,635, filed Dec. 8, 2005, which is hereby incorporated by reference herein in its entirety, including any figures, tables, or drawings.

BACKGROUND OF INVENTION

Magnetic resonance imaging (MRI) technology is used for diagnostic purposes in hospitals and medical research centers. Through the use of two magnetic fields, one static and one time-variant, MRI technicians can obtain very detailed, high resolution images of the human body.

Magnets, such as superconducting magnets, permanent magnets, and electromagnetic magnets, used in applications such as magnetic resonance imaging produce stray static magnetic fields. The magnitude of these stray fields can vary significantly depending on the distance relative to the center of the magnet. The earth produces a magnetic field slightly less than one Gauss, but fields above 5 Gauss can cause electronic devices such as pacemakers to malfunction. In addition, the magnetic field strength of an MRI magnet is often large enough to turn ferrous objects into projectiles and cause electrical devices and magnetic strips to malfunction.

The static magnetic field can extend several meters outwards from an MRI machine cavity at strengths of up to 3 Tesla, or about $3 \times 10^5$ times the strength of Earth's magnetic field. Objects with significant ferromagnetic content in the vicinity of an MRI machine can be attracted to this field and accelerated at high speeds toward the cavity, posing a significant risk of damage to the machine and the threat of injury to patients undergoing scanning. The removal of foreign ferromagnetic objects from an MRI cavity can also require the machine to be shut down completely (quenched), a time-consuming and expensive process.

Others have attempted to provide a safer environment for MRI's to be performed. U.S. Patent Application Publication No. U.S. 2004/0135687 A1 teaches a ferromagnetic object detector that measures the change in a known magnetic field when a ferrous object passes through. The detector incorporates a proximity sensor to trigger the magnetic field detector, reducing the number of false alarms. U.S. Patent Application Publication No. US 2003/0171669 A1 teaches an MRI Protector that incorporates an array of Hall sensors around an entrance to an MRI room.

BRIEF SUMMARY

Embodiments of the subject invention relate to a method and apparatus for ferrous object and/or magnetic field detection. Embodiments can improve magnetic resonance imaging (MRI) safety and increase the safety of MRI facilities. Embodiments of the subject system can detect a given magnetic field strength around a magnetic resonance imaging (MRI) machine and alert users to the field's presence. In an embodiment, the magnetic field warning system can rely on a single badge that warns its user. In another embodiment, a badge with an RFID system can be utilized. The RFID system can turn the badge on when it enters the MRI room and off when it leaves the MRI room. In another embodiment, a badge with a rechargeable battery and charger can be utilized with or without an RFID tag. The subject badges or other detection devices can be worn by a person, located on or near a ferrous object, embedded in clothing, or located in other positions convenient to a user. Examples of ferrous objects include: fire extinguishers, wheelchairs, and crash carts.

DETAILED DISCLOSURE

Figure 1:
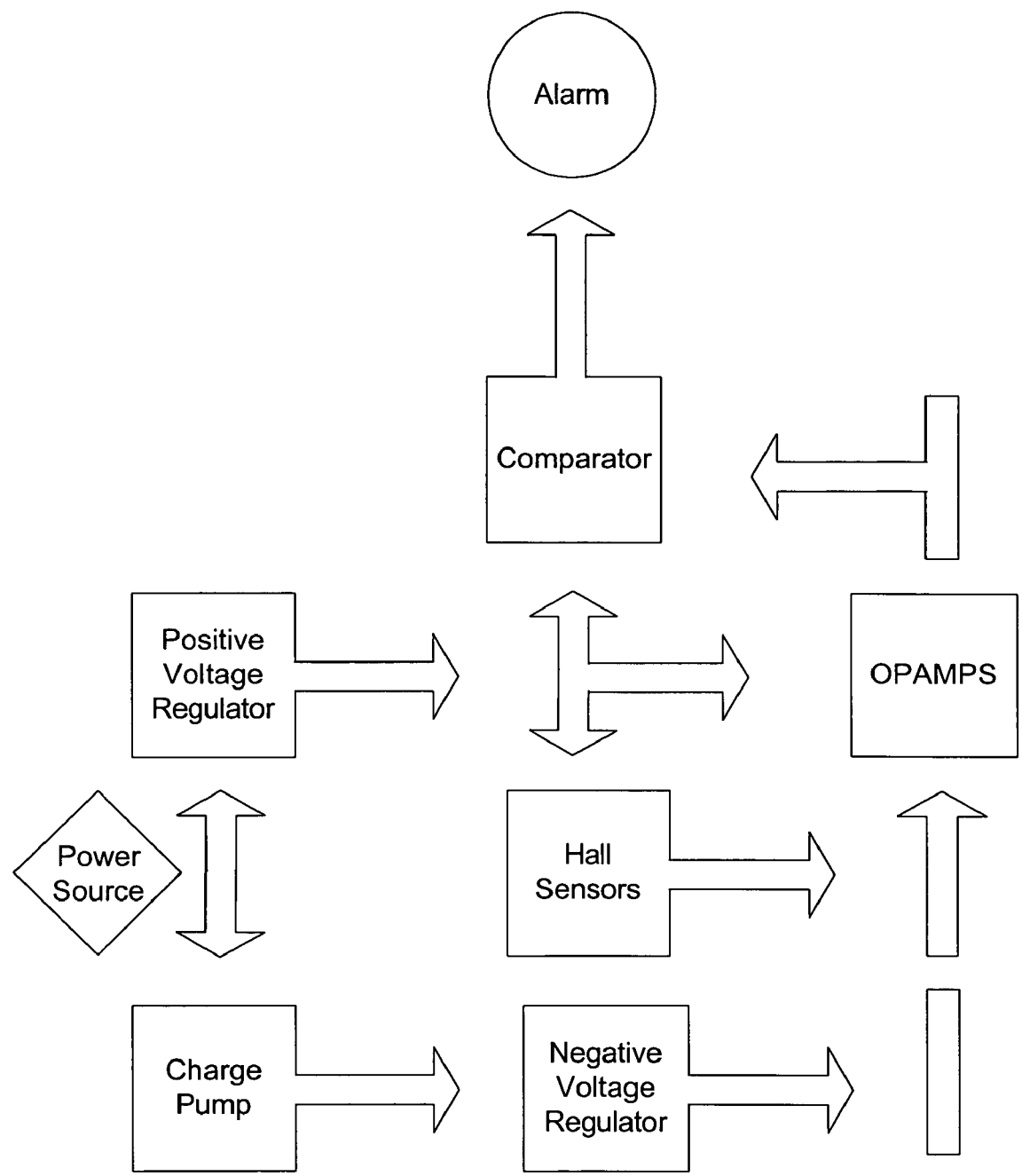
FIG. 1 shows a block diagram of an embodiment of a sensor in accordance with the subject invention.

Embodiments of the subject invention relate to a method and apparatus for ferrous object and/or magnetic field detection. Embodiments can improve magnetic resonance imaging (MRI) safety and increase the safety of MRI facilities. Embodiments of the subject system can detect a given magnetic field strength around a magnetic resonance imaging (MRI) machine and alert users to the field's presence. In an embodiment, the magnetic field warning system can rely on a single badge that warns its user. In another embodiment, a badge with an RFID system can be utilized. The RFID system can turn the badge on when it enters the MRI room and off when it leaves the MRI room. In another embodiment, a badge with a rechargeable battery and charger can be utilized with or without an RFID tag. The subject badges or other detection devices can be worn by a person, located on or near a ferrous object, embedded in clothing, or located in other positions convenient to a user. Examples of ferrous objects include: fire extinguishers, wheelchairs, and crash carts.

An embodiment incorporates a wearable badge unit powered by, for example, a lithium coin cell, which generates audible and/or visual alarms when a given magnetic field strength is detected by sensors in the badge. Advantageously, embodiments of the invention can detect static magnetic fields having magnitudes above or equal to a predetermined value, without the need for the detection device to be moving. A specific embodiment can incorporate three sensors arranged to cover three axes, a user interface (incorporating a buzzer, LED, and/or BDS via a microcontroller), hard casing with connectors between the badge and the charger, and a voltage and temperature limited charger that informs the user through LEDs. In an embodiment, the badge can incorporate an RFID tag, and an RFID reader mounted at, for example, the entrance to each MRI room can scan and activate or deactivate each badge as it enters or exits the room, thus conserving power. In another embodiment, a badge detection unit using GMR magnetic field sensors constantly powered by, for example, a lithium-polymer battery, can be utilized and can optionally use a separate unit for charging the badge when not in use. A specific embodiment incorporates a magnetic sensing badge that activates an alarm when the badge is in a magnetic field of at least a certain magnitude, such as a 5 Gauss or greater magnetic field.

Embodiments of the invention relate to a detector that alerts a person if a ferrous object is entering the vicinity of a Magnetic Resonance Imaging (MRI) magnet. Additional embodiments can provide a warning if a person approaches a certain magnitude of magnetic field.

Ferrous objects can have a badge, or other device having sensors capable of detecting magnetic fields above a certain magnitude, located on or near them such that the badge, or other device, alerts a user that the ferrous object is located in a magnetic field above the certain magnitude. The badge, or other object, can also be worn by a person to alert the person and/or other to the presence of the magnetic field. Ferrous objects can also have some sort of tag that can be detected such as an RFID tag such that detection of this tag alerts that the ferrous object is located in the monitored area. Further embodiments can include a double warning system. The first warning can be activated if a ferrous object enters the room of an MRI magnet, or other designated MRI area. The detector can differentiate between ferrous and non-ferrous metals, or other materials using, for example, magnetic fields on or near the ferrous objects. Examples of such sensors include: Hall sensors, Fluxgate sensors, anisotropic magnetoresistors (AMR's), and/or giant magnetotoresistive (GMR) sensors located on or near the ferrous objects to be monitored. Hall-effect sensors can detect static fields. Examples of sensors that can be used in accordance with the subject invention include: the Allegro A3214 and the NVE AD004-04. The first warning can provide, for example, visual and/or audible alarms. Other actions can be taken when the first warning is triggered, such as closing and/or locking doors or other apparatus to, for example, prevent or reduce likelihood of ferrous objects entering the MRI scanner. The first warning can utilize a panel structure for displaying the alarms. The first warning can be based on tracking of ferrous objects by detecting the presence of tags placed on or near the ferrous object, where the tags can be detected by a system external to the ferrous object.

A second warning can also be incorporated to provide an alert of the presence of a large magnetic field. Although a person may not possess any ferrous objects, the person may not realize that a large magnetic field is present. Such a large field can produce unwanted currents in implanted electrical devices such as pacemakers. A large field may also cause other electronic devices to fail and/or erase magnetic strips such as those on credit cards. The second level of detection can also act as a fail-safe in case of failure in the first warning by alerting a person to the presence of the large field prior to the ferrous object becoming a projectile.

The second warning system can incorporate a badge worn on a person and/or attached to a possible projectile. In embodiments, a badge can be a stand-alone device capable of detecting magnetic fields and providing signals to persons nearby or to some other system for alerting or taking other action. In other embodiments, the badge can interact with other portions of an overall system that are external to the badge. The badge can provide a warning when in the presence of a magnetic field greater than or equal to a certain magnitude. In an embodiment, to conserve battery power in the badge, a panel structure can also serve to wake the badge from a sleep mode. The panel, or other components of the system, for example, wakes the badge from a sleep mode whenever the badge is within a certain distance from a certain location or a certain position such as a perimeter of an MRI facility. Various zones can be established with external systems to determine when the badge that incorporates a tag is in a certain zone. The zones may correspond to areas having certain magnitude magnetic fields and/or areas into which it can be dangerous to be or dangerous for a ferrous object to be. In another embodiment, the badge can be turned on using RF techniques. In another embodiment, a magnetic switch can be used to wake up the badge from a sleep mode when the badge is positioned in a large enough magnetic field.

As the subject badge may be worn on the body, the temperature of the device can be considered to compensate for thermoelectric, or other temperature-related effects. In an embodiment, the badge can be constructed of non-ferromagnetic materials to prevent it from being projected toward the magnet. An embodiment of the magnetic sensor badge can use three linear Hall affect sensors to detect magnetic fields in three perpendicular directions. The badge can sound an alarm and/or light up an LED or other visual display, or trigger other alerting signals, in the presence of a certain magnitude magnetic field. In various embodiments, the magnitude of the magnetic field that triggers the alert is a 5 Gauss field, a 10 Gauss field, a 20 Gauss field, and a 50 Gauss field, respectively. In another embodiment, a certain magnetic field, for example, a 100 Gauss field, can trigger a buzzer to sound where the buzzer has a different sound, volume, or other characteristic. Other techniques, such as a mechanical vibration, can be used to alert the wearer of the badge and/or others.

Various embodiments can use one or more of the following type of detectors to detect a certain size magnetic field: GMR magnetic field sensor, AMR magnetic field sensor, induction magnetic field sensor, Hall effect magnetic field sensor, Flux gate magnetic field sensor, and SQUID magnetic field sensor.

In an embodiment, a first magnetic field sensor that does not consume power from the energy source on the badge or other detection device, such as a Reed switch, can be used to turn on a second magnetic field sensor once a first threshold size magnetic field is detected by the first magnetic field sensor. The second magnetic field sensor can then monitor for magnetic fields of a second threshold magnitude. In this way, as the first magnetic field sensor does not draw from the badge's battery, power can be conserved until the badge is in a region where it is likely to experience a magnetic field above the second magnitude threshold.

In an embodiment, the alarm sounds when a certain magnitude magnetic field is encountered. A 5 Gauss field can be used in a specific embodiment, because fields above 5 Gauss can cause electronic devices such as pacemakers to fail. Other magnetic field magnitudes can also be used. The second level magnetic field magnitude should be selected taking into consideration that the magnetic field strength begins to increase dramatically as the distance to the magnet decreases. An embodiment can use 100 Gauss as the second trigger magnetic field magnitude.

In an embodiment, a supply voltage to a Hall-effect sensor can be in the range of 4.5-5.5 volts. The supply voltage to the Hall-effect sensor can be the output of a positive voltage regulator. This voltage can also be supplied to the comparators and op amps.

In an embodiment, the V(oB), or voltage produced by the Hall sensor in the presence of magnetic fields, can be approximately 2.5 volts for a 5 Gauss field and approximately 3 volts for a 100 Gauss field, for an input voltage of 5 volts. Since the output voltage of the Hall sensors increases with an increasing positive magnetic field, the output of the sensors will produce a voltage that varies with magnetic field strengths.

In an embodiment, the battery voltage can be supplied by two 3-volt batteries. The batteries are preferably small and lightweight. Lithium batteries can be used because of their non-ferromagnetic property.

In an embodiment, the size of the badge is shaped similar to a nametag and has dimensions no greater than 3×3 inches for the front face and preferably no greater than 3×2 inches. In an embodiment, the badge functions properly at temperatures less than 90° F. In an embodiment, the power consumed by the device, a measure of the input power minus the output power when the device is at its highest field level of detection, is less than 400 mW. In an embodiment, if the badge were to remain on without interruption, where the battery life is measured from the time the device is first turned on to the time the low-battery monitor is signaled, the battery life is at least 125 hours.

In an embodiment, the subject detector can incorporate one or more 3515 Allegro ratiometric linear Hall-effect sensors. The 3515 produces an output voltage of $(0.5)V_{ss}$ when B=0. The device is linear and has a sensitivity of 5 mV/G. Accordingly, the output voltages at the desired field strengths using the equation:

$$\frac{B\left(5\frac{mV}{G}\right)}{1000} + \frac{V_{ss}}{2} = V_{out}$$

B=5 Gauss=0.0005 Tesla, $V_{out}$=2.486 V
B=10 Gauss=0.001 Tesla, $V_{out}$=2.51V
B=100 Gauss=0.01 Tesla, $V_{out}$=2.96 V FIG. 1 shows a block diagram of an embodiment of a sensor in accordance with the subject invention. Referring to FIG. 1, a power source supplies a voltage to sensors, opamps, and a comparator. The power source provides regulated power to the sensors, opamps and comparator through a positive voltage regulator. The opamps also receive power through a charge pump and negative voltage regulator. The output of the sensors is provided to the opamps and then sent to a comparator. The comparator can determine if a value provided from the sensors is greater than or equal to a specified value. If the value provided from the sensors is greater than or equal to the specified value, then an alarm can be generated.

In a specific embodiment, each axis can incorporate two Hall sensors, for a total of six Hall sensors, such that the additional Hall sensor for each axis can be placed as a mirror image to the original sensor for each axis, so as to measure the negative field, while the original Hall sensor measures the positive field. In an embodiment, after the 2.5 zero-field voltage is subtracted from the output of the Hall sensor, a comparator can determine the correct value by outputting the higher individual sensor voltage from each Hall sensor pair.

In an embodiment, the subject magnetic sensing badge can trigger an alarm by comparing two voltages, where the first voltage is the field magnitude voltage found by taking the square root of the sum of the squares of the Hall voltages. In an alternative embodiment, the actual field could be found and output to some device such as an LCD display.

Further embodiments can allow the badge to send a signal that allows determination of the badges location by a portion of the system external to the badge once the sensors in the badge are tripped. The signal from the badge upon the sensors being triggered can cause other actions to be taken, such as shutting down the MRI magnet if appropriate, shutting doors to the MRI room, or other actions that can reduce the risk of injury or harm. A tag, such as an RFID tag, can be located on the badge such that if the tag is detected in a certain region, similar actions are taken by the system to reduce risk of injury or harm. Embodiments of the invention can be incorporated with interventional tools for performing procedures under MRI. The badge or other detection device, or badge with a tag, can be located on or near one or more interventional tools so that if the tools enter a region with a certain magnitude magnetic field or enter a certain physical region, certain actions are taken. These actions can include alerts or other actions described above.

Embodiments can incorporate a system capable of detecting the presence of ferromagnetic objects. An example of such a system is taught in U.S. 2004/0135687, which is herein incorporated by reference. With a system to detect ferromagnetic objects, one or more other features taught above, such as a badge to detect magnetic fields above a threshold magnitude, can also be incorporated.

EXAMPLE

Figure 2:
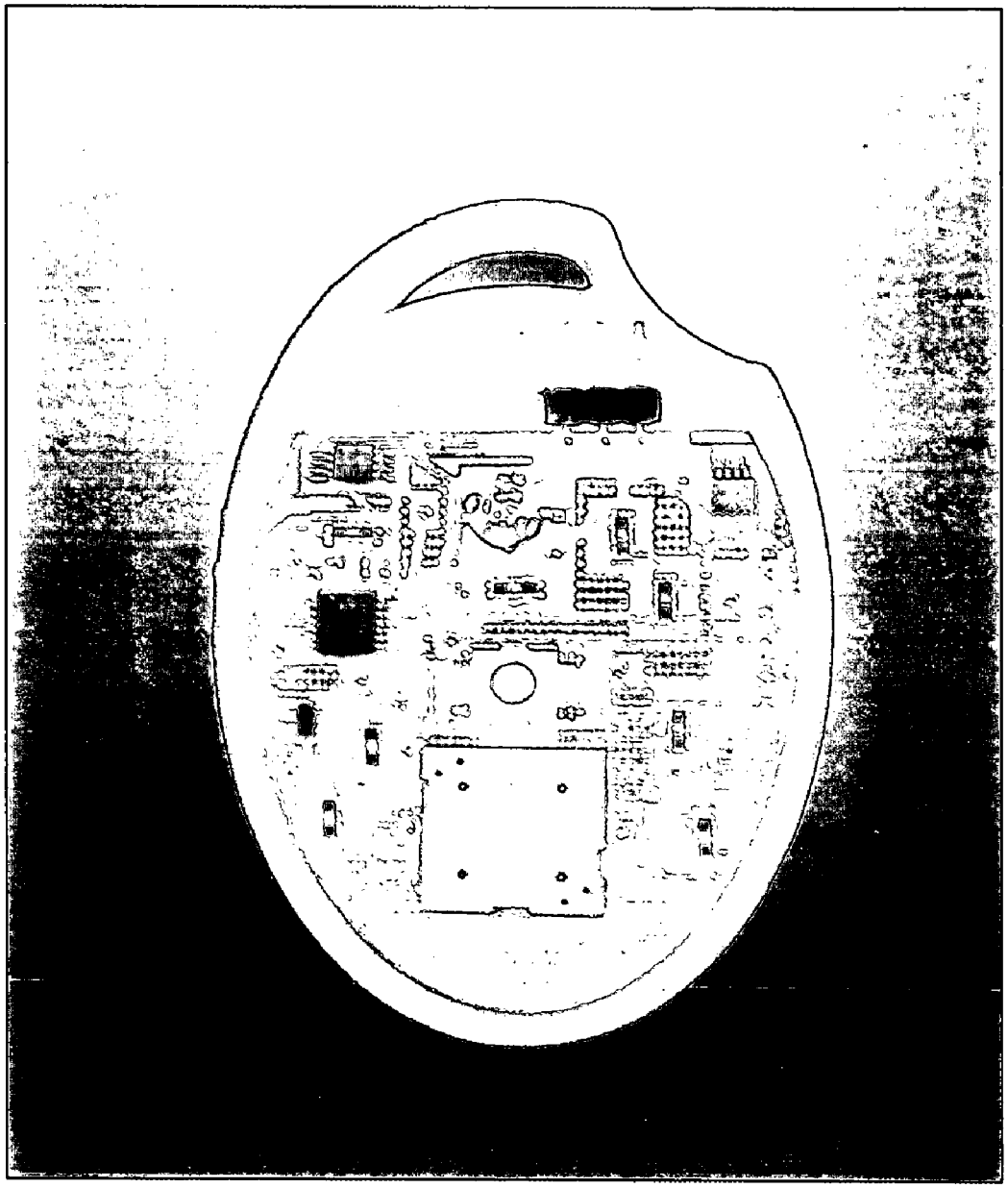
FIG. 2 shows a magnetic field detection badge in accordance with a specific embodiment of the subject invention.

The embodiment of the magnetic field safety badge discussed in this Example incorporates an electronic printed circuit board (PCB) enclosed by ABS plastic casing (see FIG. 2). The PCB is double layered and has electronic components soldered on both sides. Some of these components function together to generate a warning when the badge enters a magnetic field with strength sufficient to be potentially dangerous (around 30 Gauss). The other components are for power management and mating the badge to the rechargeable docking bay.

The magnetic field detection badge shown in FIG. 2 has three major functional subsystems: field detection, status generation, and power. These three groups are managed with a small, low power microcontroller. The components are small, low power, inexpensive, of low ferrous content, and able to continue operating in a high-intensity magnetic field without damaging the component or changing its performance. In addition, the sensors do not cause significant interference, and preferably do not cause any interference with, the MRI scanners, the buzzer is loud enough to be heard over the cooling system of the MRI magnet, and the battery is rechargeable.

The badge is powered by a rechargeable lithium-polymer battery. The charger's components can be ferromagnetic. The charger incorporates a power management chip, status LEDs, a power connector, and an edge connector.

In one embodiment, the badge is initially in an idle state, waiting to detect the presence of a field. Once the sensors detect a field, the buzzer generates an alarm for a set period of time, or until the deactivation switch is pressed. A set delay can be used before the sensors can activate the alarm again, so that the continued presence of a field would not repeatedly generate a warning. While the battery is sufficiently charged, the LED blinks occasionally to indicate that the badge is powered and operating; as the battery voltage level drops, eventually the LED stops blinking, and the buzzer chirps at set intervals to warn the user that the battery needs to be recharged. If the supply voltage drops into dangerous levels, the badge operation can be deactivated until the battery is sufficiently charged.

Packaging for the magnetic field detection device uses nonferromagnetic materials. The magnetic field detection badge can have outer dimensions less than or equal to 2.75"×1.75"×0.5". The badge can include one or more of the following: a buzzer deactivation switch, a power indicator LED, and a charging interface. In a specific embodiment, the first two of these are placed on the front of the badge to make them easily accessible, while a charging interface such as female charging leads are placed on the back of the badge.

In an embodiment of the badge described in this Example, the following parts were utilized:
1. Microcontroller form Microchip PIC16F684
2. GMR Sensors from NVE AD004-02
3. Battery Lithium-Polymer 250 mAh
4. Buzzer
5. Zener diode from National Semiconductors LM4040CIM3-2.5
6. Diode from Diode incorporated BAT400D-7
7. Button switch
8. LED and passive components including a thermistor The assembled board for an embodiment of the badge described in this Example is shown in FIG. 2. The microcontroller is the center of all operations of the badge. The microcontroller controls the power flow to the sensors by pulsing a pin that is connected to the voltage input of the sensors. The outputs of the sensors are fed to the input pins of the controller. The sensors pull the output high (VDD) if there is no field present. Once a field of more than 30 Gauss is detected, the sensors pull the output low (GND). The microcontroller then activates the buzzer by producing a square wave. The alarm can be turned off either by pressing the Buzzer Deactivation Switch (BDS) or by waiting approximately ten seconds. The badge has the ability to alert the user whenever the battery is running low. This is accomplished with the use of the A/D converter of the microcontroller. A zener diode can be used to create a voltage window for the reference voltage pin of the microcontroller. The battery's voltage can be scaled down by two and fed into the A/D pin that was assigned.

Most of the components used for the embodiment of the badge are non-ferromagnetic. The buzzer and the battery contain some ferrous material but the weight of the badge prevents it from getting attracted to the MRI machine.

In this embodiment, the two out of three sensors are placed on the main board, while the third sensor is placed on a separate board that is attached to the main board via right angle connectors. The purpose of this is to cover all three dimensions a magnetic field has in space(x, y, and z). The sensors use the giant magnetoresistive technology. The sensors form a bridge and when a field is applied, the voltage is changed. This change in voltage is then detected by the logic unit in the sensor and the output is changed accordingly. The sensors used in this embodiment are trimmed to detect a 20-30 Gauss field.

In specific embodiments, Reed switches can be utilized to detect magnetic fields. Reed switches can be used that are very sensitive so as to detect magnetic fields at a distance away from the MRI magnet. When Reed sensors are brought very close to the magnet, the 1.5 Tesla field strength can cause the Reed sensor to turn off. This does not necessarily cause a problem, but should be taken into consideration.

Embodiments of the invention can incorporate Hall Effect sensors. Hall Effect sensors tend not to be as sensitive as the most sensitive Reed switches, but can be utilized.

Embodiment of the invention can incorporate GMR sensors.

An embodiment of the badge described in this Example of an audible alarm, a BDS (deactivation switch) button, and an indication light.

One embodiment of the badge has three main states of operation, namely, idle state, magnetic field detection state, and low battery state. In the idle state, the indication light blinks every few seconds. This shows that the badge is able to detect a field and warn its user. The badge enters the magnetic field detection state when it is brought into the presence of a high enough magnetic field, such as close to an MRI machine. Once a high enough magnetic field is detected, an alarm is set off. There are two ways to turn off this alarm—one is to press the button on the front of the badge, and the other one is to wait for approximately ten seconds. While the alarm sounds, the light stops blinking and remains on while the alarm is on. When the alarm turns off, the alarm will not sound again for approximately five minutes, whether you are close to the MRI machine or not. After five minutes, the badge re-enters the idle state or returns to the magnetic field detection state and sounds the alarm if the magnetic field is still present. In the low battery state, the badge stops blinking the light and chirps the alarm. It will do so until it is charged, or until the battery becomes critically low. The badge will stay inactive until you fully charge the battery.

Figure 4:
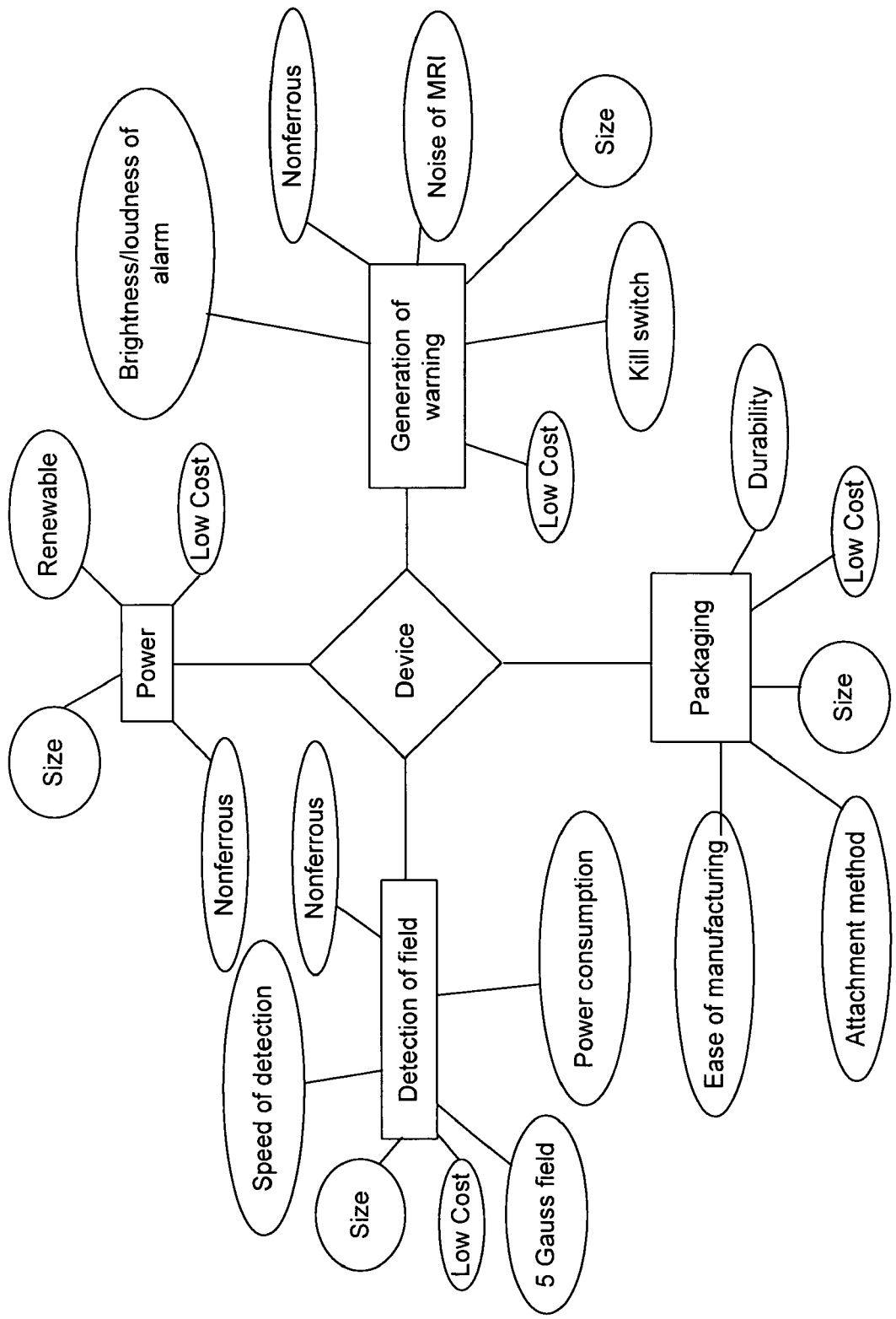
FIG. 4 illustrates some of the issues addressed by various embodiments of the subject invention and some of the issues involved with producing various embodiments of the subject invention.

Embodiments of the invention can address one or more of the following, as schematically illustrated in FIG. 4: detection of a magnetic field, generation of a warning, powering the device, and packaging the device.

For the detection of the magnetic field, a magnetic field sensor or some other means of detection can be used. Preferably, the detection means is low cost, small size, and can quickly detect, for example, a 5 Gauss field. It also should preferably be nonferrous, or substantially nonferrous, and have little power consumption.

The warning generation means should also preferably utilize low cost, nonferrous components, and small size. The brightness or loudness of the alarm vs. the MRI environment should preferably be such that the alarms are effective and an optional kill switch is also preferable.

Power supply should also preferably be nonferrous (or substantially nonferrous) and preferably rechargeable.

The badge described in this example can be worn by personnel to alert personnel to the presence of magnetic field having a magnitude above a predetermined threshold. The badge can also be attached to equipment to alert a user near the object that the object is in the presence of a magnetic field having a magnitude above a predetermined threshold. In an embodiment, the badge can incorporate an RFID tag. An RFID reader, which detects the passage of the RFID tag (and thus the badge) can be positioned in a desired location. For example, the RFID render can be positioned in a doorway to the MRI room. A wall warning unit, which is triggered by the reader as it detects the tag, can be utilized as well.

One or more GMR sensors, which work by changing the resistance of a nickel-cobalt permalloy and measuring the change in resistance in a Wheatstone bridge configuration can be utilized. Hall-Effect sensors, which use the principle of the Lorentz force on the electrons moving into a conductor, can also be utilized. Either sensor can act as a digital switch tied to a microcontroller to trigger the badge signal. In an embodiment, GMR sensors can detect 10 Gauss or higher magnetic fields. In another embodiment, Hall-Effect sensors can detect 20 Gauss or higher magnetic fields.

Figure 5:
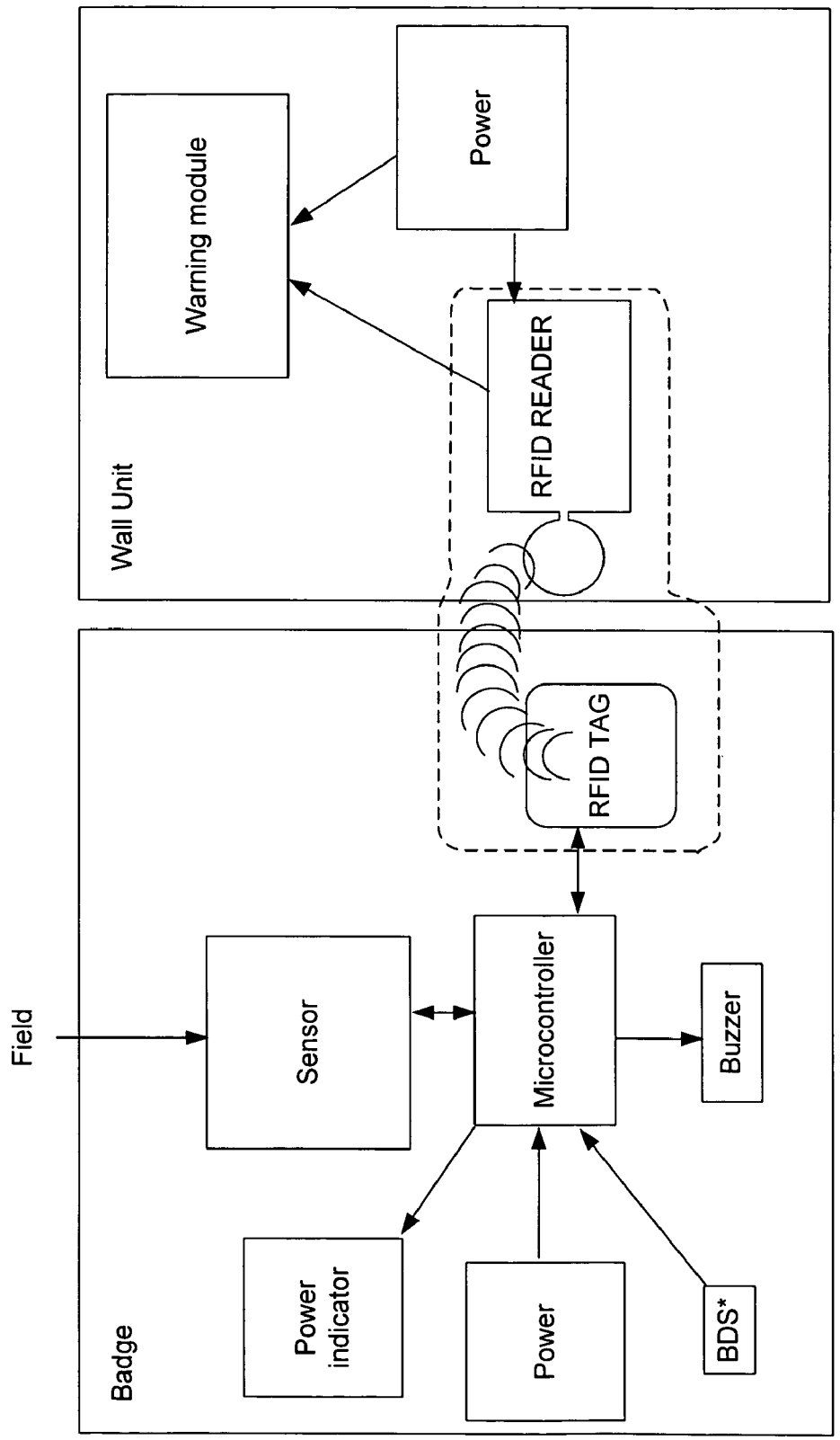
FIG. 5 shows a block diagram of a specific embodiment of the subject invention.

An embodiment of the magnetic field warning system can include a wall unit and badge unit as shown in FIG. 5. These modules can work together to provide a method of maintaining low power consumption on the badge, and to implement the ability to differentiate warnings for various badges. The wall unit can be mounted outside the door of a MRI room, while the badge unit is designed for attachment to people and/or objects. In a specific embodiment, only RFID tags are attached to inanimate objects, such that the RFID reader detects when the inanimate object is in a certain area. FIG. 5 shows the RFID tag communicating with the microcontroller.

In other embodiments, the RFID tag can be passive and the RFID tag reader can send signals to the microcontroller.

The wall unit can utilize an RFID reader, which continuously scans for an RFID tag on the badge unit. The RFID tag reader is activated when a person or object with a badge approaches the door and is within range of the reader's signal. The tag reader can then wake up the badge through the microcontroller, which can normally keep the badge in sleep mode. Keeping the badge in sleep mode is a technique for maintaining low power consumption on the badge and can allow the portable part of the system to last, in a specific embodiment, for approximately one year.

After the RFID tag receives the signal from the reader, it returns a unique ID that activates the first level of warning. This is the method by which the wall unit will be able to trigger different events for different users depending on the badge ID. The extent to which different events will be programmable will depend on the software included with the RFID reader. Advantageously, incorporating an RFID system in the detection system allows the system to provide a louder, or otherwise distinguishable, alarm for especially dangerous objects, such as ferrous oxygen tanks. In an additional embodiment, an Electronic Article Surveillance (EAS) system such as those found at the front of retail stores can be incorporated with the subject detection system, such that the EAS tags placed on, or near ferrous objects and/or people, can be detected. Tags, such as EAS tags, can be used when it is not needed to differentiate between different EAS tags.

With the microcontroller taken out of sleep mode, the badge powers up and performs a system level diagnostic. With the sensor scanning for the presence of a strong magnetic field, the badge can provide a second level of warning when the badge passes into a potentially dangerous region of the MRI room where the magnetic field is higher and/or when the system designer determines there is more danger. The magnetic field sensor on the badge will be triggered at a particular operating point, sending a signal to the microcontroller. The microcontroller can poll for this signal or receive an interrupt before activating the second level of warning, such as a buzzer.

The badge can have a buzzer deactivation switch (BDS) that allows a person to consciously turn off the buzzer. If such a BDS is used, this should be done only if the person is sure that he/she is in no position to bring ferrous material further into the room. When a person leaves the room the reader can scan the tag again and turn off the badge. The microcontroller programming can be set up so that if the BDS is set, the badge will not be reactivated when the tag is scanned on the way out of the room. Also, the programming for the RFID reader can take into account when a badge is leaving or entering the room.

Possible warning methods integrated into the wall unit include, but are not limited to, a voice warning, floodlight, strobe light, siren, or some combination thereof.

The RFID reader can incorporate an on-board microprocessor and memory, communication ports, auxiliary lines, and antenna ports. The microcontroller and the software for the reader can be programmed to make the system function as a whole.

Figure 3:
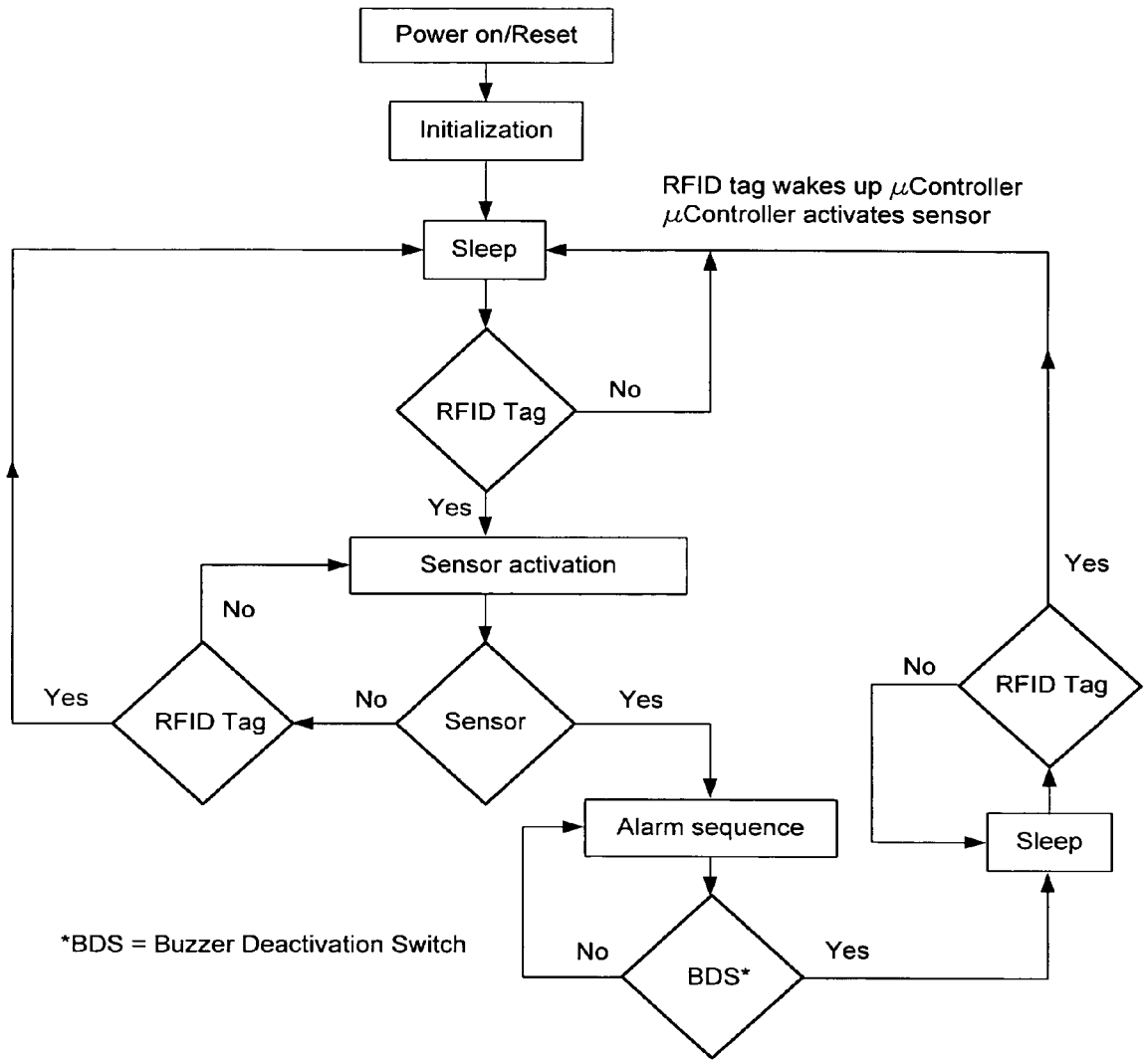
FIG. 3 shows a flowchart of a microcontroller's regulation of a badge in accordance with a specific embodiment of the subject invention.

The microcontroller can be programmed using assembly code. Referring to FIG. 3, a flowchart is shown of a simplified version of the microcontroller's regulation of badge operations in accordance with an embodiment of the subject invention. Referring to FIG. 3, the microcontroller initialization sequence begins when batteries are placed in the badge. Immediately after initialization the microcontroller goes to hibernation. Once the RFID tag is scanned the microcontroller starts up and activates the magnetic field sensor. When the sensor is triggered by the magnetic field a signal is sent to the microcontroller, which begins the alarm sequence and pulses the buzzer. If the buzzer deactivation switch (BDS) is depressed, the microcontroller turns off the buzzer and then returns to hibernation and the beginning of the process flow.

Figure 6:
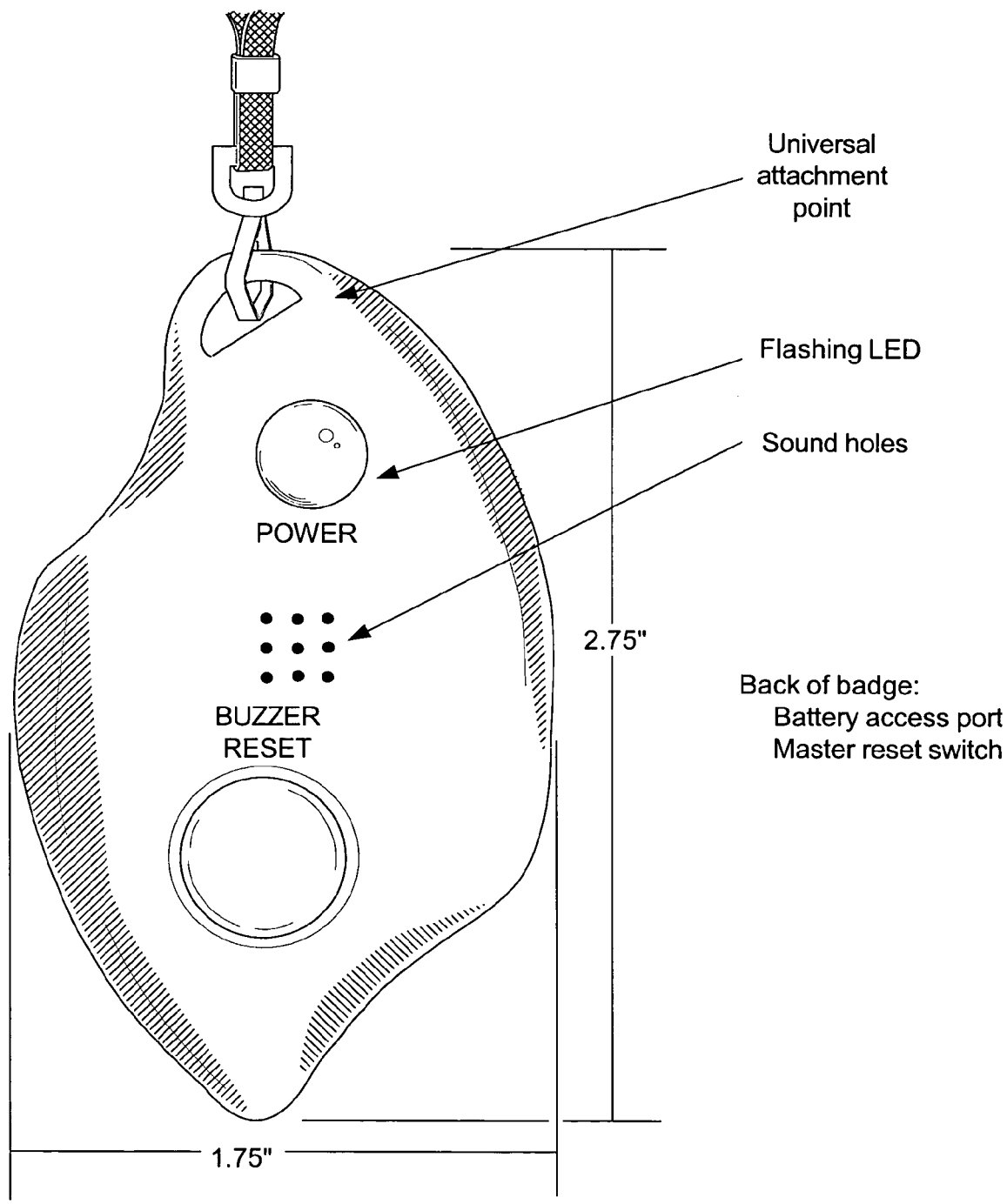
FIG. 6 shows a badge in accordance with a specific embodiment of the subject invention.
Figure 7A:
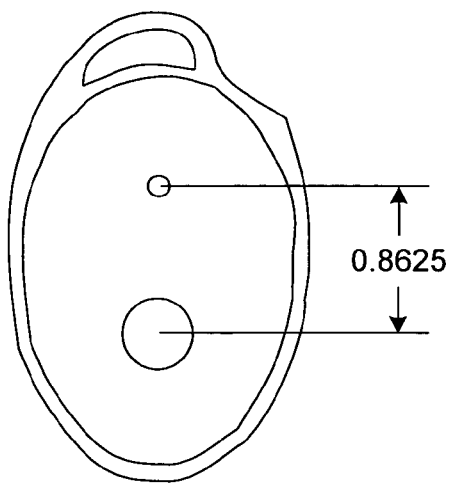
FIGS. 7A-7C and 8A-8C show the dimensions of a housing for a badge in accordance with the subject invention.
Figure 7B:
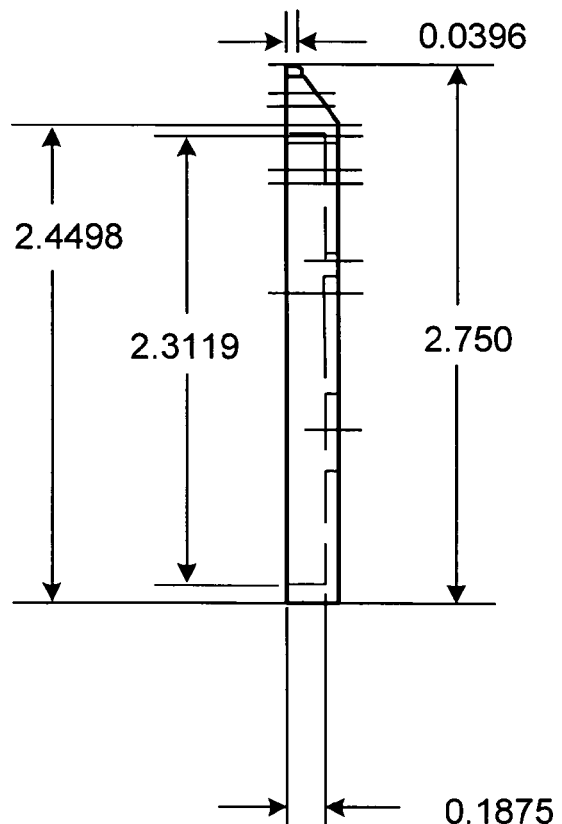
Figure 7C:
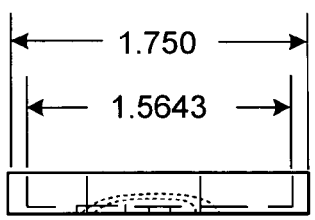
Figure 8A:
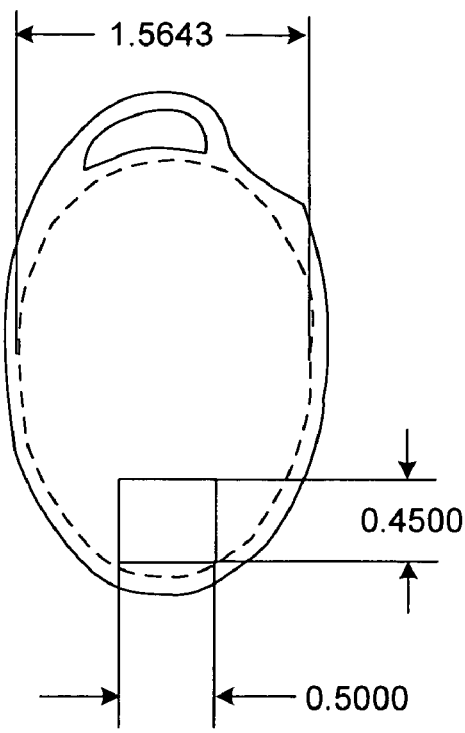
Figure 8B:
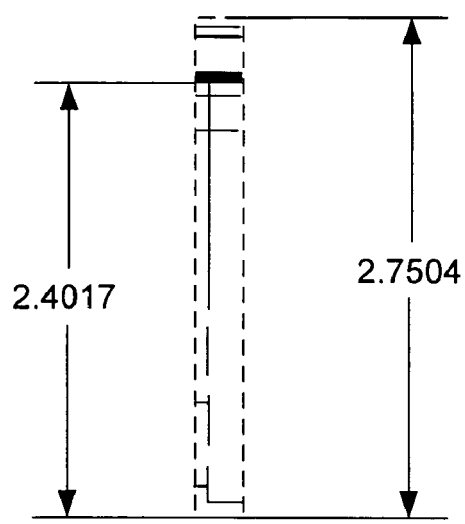
Figure 8C:
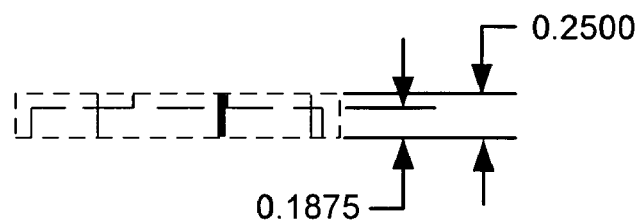

Referring to FIG. 6, various features of a badge's user interface in accordance with an embodiment of the invention is shown. The universal attachment point allows end users to select their own method of attachment, such as a lanyard, wrist strap, or hinged clip. A flashing LED can be on continuously to indicate an active power supply. A second LED may be added that indicates low power levels. The buzzer reset button can allow users to turn off the secondary warning buzzer once they have been alerted to the presence of a magnetic field. A pinhole master reset switch on the back can allow for a total reset of the system in order to return all components to their original settings. FIGS. 7A-7C and 8A-8C show the dimensions of a specific embodiment of the housing, for a badge in accordance with the subject invention. In an embodiment, the casing for the badge unit can be high-impact polycarbonate or ABS plastic for durability, lightness, and nonferromagnetism.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application.

What is claimed is:

1. An apparatus for magnetic field detection, comprising: a magnetic field detector comprising one or more magnetic field sensors for detecting a threshold magnitude magnetic field; a user interface for generating an alert to a user upon detection of the threshold magnitude magnetic field; a power supply; wherein the magnetic field detector, the power supply, and the user interface are utilized in a single package, wherein the one or more magnetic field sensors comprise three magnetic field sensors, wherein the three magnetic field sensors detect magnetic fields in three perpendicular directions.

2. The apparatus according to claim 1, wherein the three magnetic field sensors comprise three linear Hall effect sensors.

3. An apparatus for magnetic field detection, comprising: a magnetic field detector comprising one or more magnetic field sensors for detecting a threshold magnitude magnetic field; a user interface for generating an alert to a user upon detection of the threshold magnitude magnetic field; a power supply; wherein the magnetic field detector, the power supply, and the user interface are utilized in a single package, wherein the one or more sensors comprise one or more sensors selected from the following type of sensors: a giant magnetoresistive (GMR) sensor, a flux gate sensor, an anisotropic magnetoresistors (AMR) sensor, an induction magnetic field sensor, a SQUID magnetic field sensor, and a linear Hall effect sensor.

4. The apparatus according to claim 3, wherein the one or more magnetic field sensors comprise a first magnetic field sensor that does not consume power from the power supply, wherein the first magnetic field sensor turns on a second magnetic field sensor once the first threshold magnitude magnetic field is detected by the first magnetic field sensor.

5. The apparatus according to claim 4, wherein the first magnetic field sensor is a Reed switch.

6. The apparatus according to claim 3, further comprising a RFID tag utilized in the single package.

7. The apparatus according to claim 6, further comprising an RFID tag reader for reading the RFID tag when the single package enters a specified area and a means for activating the power supply upon reading the RFID tag.

8. The apparatus according to claim 7, further comprising a panel structure proximate the specified area, wherein a first warning is provided by the panel structure upon the RFID tag reader reading the RFID tag when the single package enters the specified area.

9. The apparatus according to claim 7, further comprising a means for deactivating the power supply upon the RFID tag reader reading the RFID tag when the single package exits the specified area.

10. The apparatus according to claim 9, wherein the specified area is an MRI facility.

11. The apparatus according to claim 3, wherein the alert to the user comprises visual and/or audible alarms.

12. The apparatus according to claim 3, wherein upon detection of the threshold magnitude magnetic field, the user interface also sends a signal to effect the closing and/or locking doors or other apparatus to prevent or reduce access to an MRI scanner.

13. The apparatus according to claim 3, wherein the single package is worn by the user as a badge.

14. The apparatus according to claim 13, wherein the badge is shaped as a nametag.

15. The apparatus according to claim 14, wherein the badge has dimensions no greater than 3.times.2 inches for its front face.

16. The apparatus according to claim 3, wherein power consumption of the single package is less than 400 mW.

17. The apparatus according to claim 3, wherein the single package is embedded in clothing.

18. The apparatus according to claim 3, wherein the single package is located on or near a ferrous object.

19. An apparatus for magnetic field detection, comprising: a magnetic field detector comprising one or more magnetic field sensors for detecting a threshold magnitude magnetic field; a user interface for generating an alert to a user upon detection of the threshold magnitude magnetic field; a power supply; wherein the magnetic field detector, the power supply, and the user interface are utilized in a single package, wherein the magnetic field sensors detect a second threshold magnitude magnetic field, wherein the second threshold magnitude is larger than the first threshold magnitude magnetic field, wherein the user interface generates a second alert upon detection of the second threshold magnitude magnetic field.

20. An apparatus for magnetic field detection, comprising: a magnetic field detector comprising one or more magnetic field sensors for detecting a threshold magnitude magnetic field; a user interface for generating an alert to a user upon detection of the threshold magnitude magnetic field; a power supply; wherein the magnetic field detector, the power supply, and the user interface are utilized in a single package, wherein the one or more magnetic field sensors comprise six Hall effect sensors, wherein two Hall effect sensors are positioned on an x-axis, two Hall effect sensors are positioned on a y-axis, and two Hall effect sensors are positioned on a z-axis, wherein one of the two Hall effect sensors for each axis provides a measurement for a positive magnetic field along the axis and the other one of the two Hall effect sensors for each axis provides a measurement for a negative magnetic field along the axis.

* * * * *

UNITED STATES PATENT AND TRADEMARK OFFICE
CERTIFICATE OF CORRECTION

PATENT NO. : 7,696,751 B2
APPLICATION NO. : 11/635417
DATED : April 13, 2010
INVENTOR(S) : David A. Molyneaux, Jeanette Ciesla and Dimitris Tsalikis It is certified that error appears in the above-identified patent and that said Letters Patent is hereby corrected as shown below:

Column 11,
Line 32, "3.times.2 inches" should read --3×2 inches--.

Signed and Sealed this

Twenty-ninth Day of June, 2010

David J. Kappos
*Director of the United States Patent and Trademark Office*